(12) United States Patent
Yamaguchi

(10) Patent No.: US 7,359,475 B2
(45) Date of Patent: Apr. 15, 2008

(54) COUNTER CIRCUIT AND SEMICONDUCTOR DEVICE CONTAINING THE SAME

(75) Inventor: Masaya Yamaguchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/328,076

(22) Filed: Jan. 10, 2006

(65) Prior Publication Data
US 2006/0159218 A1 Jul. 20, 2006

(30) Foreign Application Priority Data
Jan. 14, 2005 (JP) ............................. 2005-007993

(51) Int. Cl.
*G06M 1/00* (2006.01)
(52) U.S. Cl. .......................................... 377/82; 377/44
(58) Field of Classification Search ..................... None
See application file for complete search history.

(56) References Cited
U.S. PATENT DOCUMENTS 4,924,484 A * 5/1990 Grasso et al. ............... 377/116
5,128,673 A * 7/1992 Tamamura et al. .......... 341/100
5,226,063 A * 7/1993 Higashitsutsumi ............ 377/44
5,321,733 A * 6/1994 Tamamura et al. ........... 377/44
5,737,381 A * 4/1998 Shimomura et al. .......... 377/52
6,795,520 B2 * 9/2004 Van Der Valk ............. 377/115
6,961,402 B1 * 11/2005 Younis ........................ 377/44
7,123,679 B2 * 10/2006 Joo ............................. 377/106

FOREIGN PATENT DOCUMENTS

JP          10-303738          11/1998

* cited by examiner

*Primary Examiner*—Cassandra Cox
(74) *Attorney, Agent, or Firm*—McGinn IP Law Group, PLLC

(57) ABSTRACT

A counter circuit includes a counter section having flip-flops of a plurality of stages. The flip-flops from a first stage to an $(N-1)^{th}$ (N is an integer more than 2) stage synchronously count a clock signal. A mask circuit section controls supply of the clock signal to the flip-flop of an N stage based on outputs of the flip-flops from the first stage to the $(N-1)^{th}$ stage.

13 Claims, 6 Drawing Sheets

Fig. 2A PRIOR ART CLK
Fig. 2B PRIOR ART Q0
Fig. 2C PRIOR ART Q1
Fig. 2D PRIOR ART Q2

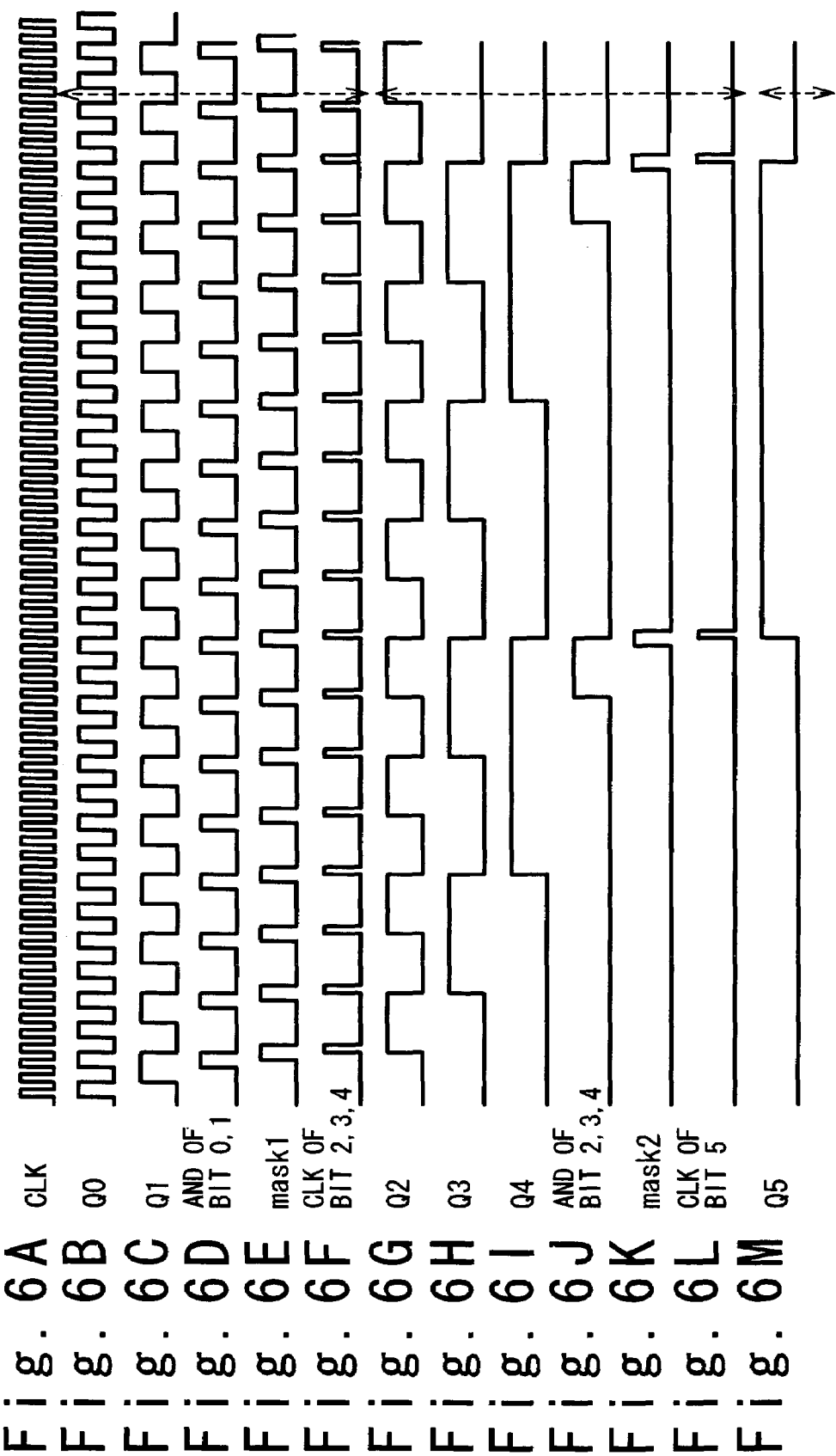

COUNTER CIRCUIT AND SEMICONDUCTOR DEVICE CONTAINING THE SAME

BACKGROUND OF THE INVENTION

This application claims priority to Japanese Patent Application No. 2005-007993, filed on Jan. 14, 2005.

1. Field of the Invention

The present invention generally relates to a semiconductor device, and more specifically to a semiconductor device with a counter circuit.

2. Description of the Related Art

In a semiconductor device, a large number of circuit elements such as transistors, resistors, and capacitors are formed on a semiconductor substrate, and the circuit elements are connected to achieve a desired circuit operation and function. A counter circuit is a circuit used when a clock timer and an interval timer are formed.

FIG. 1 is a circuit diagram showing an arrangement of a conventional 3-bit synchronous type counter circuit. Referring now to FIG. 1, the conventional counter circuit is provided with flip-flops F10 to F12, an inverter circuit G1, an exclusive-OR gate circuit (will be referred to as "EXOR circuit" hereinafter) G2, and AND gate circuit G3, and another EXOR circuit G4.

A clock signal CLK is connected to clock input terminals C of the flip-flops F10 to F12. A reset signal RST is connected to reset terminals R of these flip-flops F10 to F12. An output terminal Q0 of the flip-flop F10 is connected to an external output terminal Q0, and connected via the inverter circuit G1 to a data input terminal D of the flip-flop F10. Also, the output terminal Q0 of the flip-flop F10 is connected to one input terminal of the EXOR circuit G2, and one input terminal of the AND gate circuit G3. An output terminal Q1 of the flip-flop F11 is connected to external output terminal Q1 and the other input terminal of the EXOR circuit G2. Also, the output terminal Q1 of he flip-flop F11 is connected to the other input terminal of the AND circuit G3. An output terminal of the EXOR circuit G2 is connected to the data input terminal D of the flip-flop F11. An output terminal Q2 of the flip-flop F12 is connected to an external output terminal Q2 and one input terminal of the EXOR circuit G4. Also, an output terminal of the AND gate circuit G3 is connected to the other input terminal of the EXOR circuit G4. An output terminal of the EXOR circuit G4 is connected to a data input terminal D of the flip-flop F12. As described above, the conventional synchronous type counter circuit shown in FIG. 1 is provided with the flip-flops F10 to F12 to which both of the clock signal CLK and the reset signal RST are supplied, the AND circuit G3 for carrying up the counter circuit, and the EXOR circuit G4.

Referring now to FIG. 2A to FIG. 2D, a description is made of operations as to the conventional synchronous type counter circuit shown in FIG. 1. First, the reset signal RST is supplied to the flip-flops F10 to F12, so that the outputs Q0 to Q2 of the flip-flops F10 to F12 are set to "0", as shown in FIG. 2B to 2D. The output Q0 (=0) of the flip-flop F10 is inverted to "1" by the inverter circuit G1, and the value "1" is supplied to the data input terminal D of the flip-flop F10. The outputs Q0 and Q1 of the flip-flops F10 and F11 are "0", and the EXOR circuit G2 supplies "0" to the data input terminal D of the flip-flop F11. Since the output Q0 and Q1 of the flip-flops F10 and F11 are "0", the output of the AND gate circuit G3 becomes "0". Also, the output Q2 of the flip-flop F12 is "0". As a result, the EXOR circuit G4 supplies "0" to the data input terminal D of the flip-flop F12.

In this state, a first pulse of the clock signal CLK is supplied to the flip-flops F10 to F12, as shown in FIG. 2A. As a result, the output Q0 (=0) of the flip-flop F10 is changed into "1" in response to the pulse of the clock signal CLK, while the output Q1 of the flip-flop F11 and the output Q2 of the flip-flop F12 remain at "0", as shown in FIG. 2B to FIG. 2D. The output Q0 of the flip-flop F10 is inverted by the inverter circuit G1, so that "0" is supplied to the data input terminal D of the flip-flop F10. Since the output Q1 of the flip-flop F10 is "1" and the output Q1 of the flip-flop F11 is "0", the EXOR circuit G2 supplies "1" to the data input terminal D of the flip-flop F11. Also, since the output of the AND gate circuit G3 is "0" and the output Q2 of the flip-flop F12 is "0", the EXOR circuit G4 supplies "0" to the data input terminal D of the flip-flop F12.

Next, as shown in FIG. 2A, a second pulse of the clock signal CLK is supplied to the flip-flops F10 to F12. As a result, as shown in FIG. 2B to FIG. 2D, in response to the second pulse of the clock signal CLK, the output Q0 of the flip-flop F10 is changed from "1" to "0", the output Q1 of the flip-flop F11 is changed from "0" to "1", and the output Q2 of the flip-flop F12 remains at "0". The output Q0 of the flip-flop F10 is inverted by the inverter circuit G1, and the value "1" is supplied to the data input terminal D of the flip-flop F10. Since the output Q0 of the flip-flop F10 is "0" and the output Q1 of the flip-flop F11 is "1", the EXOR circuit G2 supplies 1 "1" to the data input terminal D of the flip-flop F11. Also, since the output of the AND gate circuit G3 is "0", and the output Q2 of the flip-flop F12 is "0", the EXOR circuit G4 supplies "0" to the data input terminal D of the flip-flop F12.

Next, as shown in FIG. 2A, a third pulse of the clock signal CLK is supplied to the flip-flops F10 to F12. As a result, as shown in FIG. 2B to FIG. 2D, in response to this clock signal CLK, the output Q0 of the flip-flop F10 is changed from "0" to "1", the output Q1 of the flip-flop F11 remains at "1", and the output Q2 of the flip-flop F12 remains at "0". The output Q0 of the flip-flop F10 is inverted by the inverter circuit G1, and "0" is supplied to the data input terminal D of the flip-flop F10. Since the output Q0 of the flip-flop F10 if "1" and the output Q1 of the flip-flop F11 is "1", the EXOR circuit G2 supplies "0" to the data input terminal D of the flip-flop F11. Also, since the output of the AND gate circuit G3 is "1", and the output Q2 of the flip-flop F12 is "0", the EXOR circuit G4 supplies "1" to the data input terminal D of the flip-flop F12.

Next, as shown in FIG. 2A, a fourth pulse of the clock signal CLK is supplied to the flip-flops F10 to F12. As a result, as shown in FIG. 2B to FIG. 2D, in response to the fourth pulse of the clock signal CLK, the output Q0 of the flip-flop F10 is changed from "1" to "0", the output Q1 of the flip-flop F11 is changed from "1" to "0", and the output Q2 of the flip-flop F12 is changed from "0" to "1". The output Q0 of the flip-flop F10 is inverted by the inverter circuit G1, and "1" is supplied to the data input terminal D of the flip-flop F10. Since the output Q0 of the flip-flop F10 is "0" and the output Q1 of the flip-flop F11 is "0", the EXOR circuit G2 supplies "0" to the data input terminal D of the flip-flop F11. Also, since the output of the AND gate circuit G3 is "0", and the output Q2 of the flip-flop F12 is "1", the EXOR circuit G4 supplies "1" to the data input terminal D of the flip-flop F12.

Hereinafter, an operation similar to the above-described counting operation of the conventional counter circuit is repeatedly carried out every time a pulse of the clock signal CLK is supplied.

In this way, the flip-flop F10 divides the frequency of the clock signal CLK by "2", the flip-flop F11 divides the frequency of the clock signal CLK by "4", and the flip-flop F12 divides the frequency of the clock signal CLK by "8".

However, in the counter circuit shown in FIG. 1, as shown in the timing chart of FIG. 2A to FIG. 2D, it is sufficient to the flip-flop F12 that the first one of the 4 pulses of the clock signal CLK is supplied to the flip-flop F12. However, the remaining 3 pulses are also supplied to the flip-flop F12. As a result, the flip-flop F12 operates by the three clock pulses in a useless manner, so that extra electric power is consumed.

Also, since an opportunity that the counter circuit operates in the extra manner increases, there a great possibility that noise is generated due to slight fluctuation in current and voltage in circuit elements themselves. Also, in order to suppress power consumption, an asynchronous type counter circuit may be satisfactorily used. Such an asynchronous type counter circuit is not suitably used in case that a delay with reference to a reference clock is large, a correct clock generation such as a times is required, and the counter circuit is used in a high-speed operation.

Another conventional counter is disclosed in Japanese Laid Open Patent Application (JP-A-Heisei 10-303738). In this conventional counter, an external setting value indicative of a counting end value is divided into an upper bit portion and a lower bit portion. A first counter circuit is used for the lower bit portion, whereas a second counter circuit with a small circuit scale and small power consumption is used for the upper bit portion. The first circuit unit counts a high frequency clock, and a clock obtained by frequency-dividing the high frequency clock is supplied to the second counter circuit.

SUMMARY OF THE INVENTION

In an aspect of the present invention, a counter circuit includes a counter section comprising flip-flops of a plurality of stages, wherein the flip-flops from a first stage to an $(N-1)^{th}$ (N is an integer more than 2) stage synchronously count a clock signal; and a mask circuit section configured to control supply of the clock signal to the flip-flop of an N stage based on outputs of the flip-flops from the first stage to the $(N-1)^{th}$ stage.

Here, the mask circuit section may include a permission signal generating section configured to generate a permission signal based on the outputs of the flip-flops from the first stage to the $(N-1)^{th}$ stage; and a permitting section configured to permit the supply of the clock signal to the flip-flop of the N stage based on the permission signal.

In this case, the permission signal generating section may include a mask flip-flop configured to receive a logical product of the outputs of the flip-flops from the first stage to the $(N-1)^{th}$ stage in synchronization with the clock signal, and to output the permission signal from an output terminal thereof. Also, the permitting section may include a logical product circuit configured to supply a logical product of the permission signal and the clock signal to a clock signal terminal of the flip-flop of the N stage.

Also, the permission signal generating section preferably generates the permission signal before the supply of the clock signal to the flip-flop of the N stage is permitted by a half period of the clock signal.

In this case, the permission signal generating section further may include an inverter circuit configured to invert the clock signal. The mask flip-flop receives the clock signal inverted by the inverter circuit at a clock signal terminal thereof.

In another aspect of the present invention, a counter circuit includes a counter section and first and second mask circuits. The counter section contains flip-flops of a plurality of stages, and the flip-flops from a first stage to an $(N-1)^{th}$ (N is an integer more than 2) stage synchronously count a clock signal. The first mask circuit section supplies a first clock signal generated from the clock signal based on outputs of the flip-flops from the first stage to the $(N-1)^{th}$ stage to the flip-flop of an $N^{th}$ stage. The flip-flops from the $N^{th}$ stage to an $(M-1)^{th}$ stage (M is an integer more than N) synchronously count the first clock signal. The second mask circuit section controls supply of a second clock signal generated from the clock signal based on outputs of the flip-flops from the $N^{th}$ stage to the $(M-1)^{th}$ stage to the flip-flop of an $M^{th}$ stage.

Here, the first mask circuit section may include a first permission signal generating section configured to generate a first permission signal based on the outputs of the flip-flops from the first stage to the $(N-1)^{th}$ stage, and a first permitting section configured to permit the clock signal to be supplied to the flip-flop of the $N^{th}$ stage as the first clock signal based on the first permission signal. The second mask circuit section may include a second permission signal generating section configured to generate a second permission signal based on the outputs of the flip-flops from the $N^{th}$ stage to the $(M-1)^{th}$ stage, and a second permitting section configured to permit the clock signal to be supplied to the flip-flop of the $M^{th}$ stage as the second clock signal based on the second permission signal.

In this case, the first permission signal generating section preferably includes a first mask flip-flop configured to receive a logical product of the outputs of the flip-flops from the first stage to the $(N-1)^{th}$ stage at an data input terminal thereof in synchronization with the clock signal and to output the first permission signal from an output terminal thereof. Also, the first permitting section may include a first logical product circuit configured to supply a logical product of the first permission signal and the clock signal to a clock signal terminal of the flip-flop of the $N^{th}$ stage as the first clock signal. The second permission signal generating section preferably includes a second mask flip-flop configured to receive a logical product of the outputs of the flip-flops from the $N^{th}$ stage to the $(M-1)^{th}$ stage at an data input terminal thereof in synchronization with the first clock signal and to output the second permission signal from an output terminal thereof. Also, the second permitting section may include a second logical product circuit configured to supply a logical product of the second permission signal and the clock signal to a clock signal terminal of the flip-flop of the $M^{th}$ stage as the second clock signal.

Also, the first permission signal generating section preferably generates the first permission signal before the supply of the clock signal to the flip-flop of the $N^{th}$ stage is permitted by a half period of the clock signal. The second permission signal generating section preferably generates the second permission signal before supply of the clock signal to the flip-flop of the $M^{th}$ stage is permitted by a half period of the clock signal.

In this case, the first permission signal generating section may further include a first inverter circuit to invert the clock signal. The first mask flip-flop receives the clock signal inverted by the first inverter circuit at the clock signal terminal. Also, the second permission signal generating section may further include a second inverter circuit to invert the clock signal. The second mask flip-flop receives the clock signal inverted by the second inverter circuit at the clock signal terminal.

In another aspect of the present invention, a method of counting a clock signal is achieved by synchronously counting a clock signal by flip-flops from a first stage to an $(N-1)^{th}$ stage (N is an integer more than 2); by generating a first clock signal from the clock signal based on outputs of the flip-flops from the first stage to the $(N-1)^{th}$ stage; and by counting the first clock signal by a flip-flop of an $N^{th}$ stage.

The method may be achieved by further synchronously counting the first clock signal by the flip-flops from the $N^{th}$ stage to an $(M-1)^{th}$ stage (M is an integer more than N) stage; generating a second clock signal from the clock signal based on outputs of the flip-flops from the $N^{th}$ stage to an $(M-1)^{th}$ stage; and counting the second clock signal by a flip-flop of an $M^{th}$ stage.

Here, the generating a first clock may be achieved by generating a first permission signal based on the outputs of the flip-flops from the first stage to the $(N-1)^{th}$ state; and by generating the first clock signal from the clock signal in response to the first permission signal to supply to the flip-flop of the $N^{th}$ stage. Also, the generating a second clock signal may be achieved by generating a second permission signal based on the outputs of the flip-flops from the $N^{th}$ stage to an $(M-1)^{th}$ stage; and by generating the second clock signal from the clock signal in response to the second permission signal to supply to the flip-flop of the $M^{th}$ stage.

In this case, the generating the second clock signal is preferably achieved by generating the first permission signal before timing at which the clock signal should be supplied to the flip-flop of the $N^{th}$ stage by a half period of the clock signal. Also, the generating the second clock signal is preferably achieved by generating the second permission signal before timing at which the clock signal should be supplied to the flip-flop of the $M^{th}$ stage by a half period of the clock signal.

In another aspect of the present invention, a semiconductor device includes a counter circuit. The counter circuit may include a counter section comprising flip-flops of a plurality of stages, wherein the flip-flops from a first stage to an $(N-1)^{th}$ (N is an integer more than 2) stage synchronously count a clock signal; and a mask circuit section configured to control supply of the clock signal to the flip-flop of an N stage based on outputs from the flip-flops from the first stage to the $(N-1)^{th}$ stage.

In another aspect of the present invention, a semiconductor device includes a counter circuit. The counter circuit may include a counter section comprising flip-flops of a plurality of stages, wherein the flip-flops from a first stage to an $(N-1)^{th}$ (N is an integer more than 2) stage synchronously count a clock signal; a first mask circuit section configured to supply a first clock signal generated from the clock signal based on outputs of the flip-flops from the first stage to the $(N-1)^{th}$ stage to the flip-flop of an $N^{th}$ stage, wherein the flip-flops from the $N^{th}$ stage to an $(M-1)^{th}$ stage (M is an integer more then N) synchronously count the first clock signal; and a second mask circuit section configured to control supply of a second clock signal generated from the clock signal based on outputs of the flip-flops from the $N^{th}$ stage to the $(M-1)^{th}$ stage to the flip-flop of an $M^{th}$ stage.

BRIEF DESCRIPTION OF THE DRAWINGS

FIGS. 2A to 2D are timing charts showing an operation of the conventional counter circuit;

FIGS. 6A to 6M are timing charts showing an operations of the counter circuit in the second embodiment.

DESCRIPTION OF THE PREFERRED EMBODIMENTS

Hereinafter, a semiconductor device with a counter circuit according to the present invention will be described in detail with reference to the attached drawings.

Figure 1:
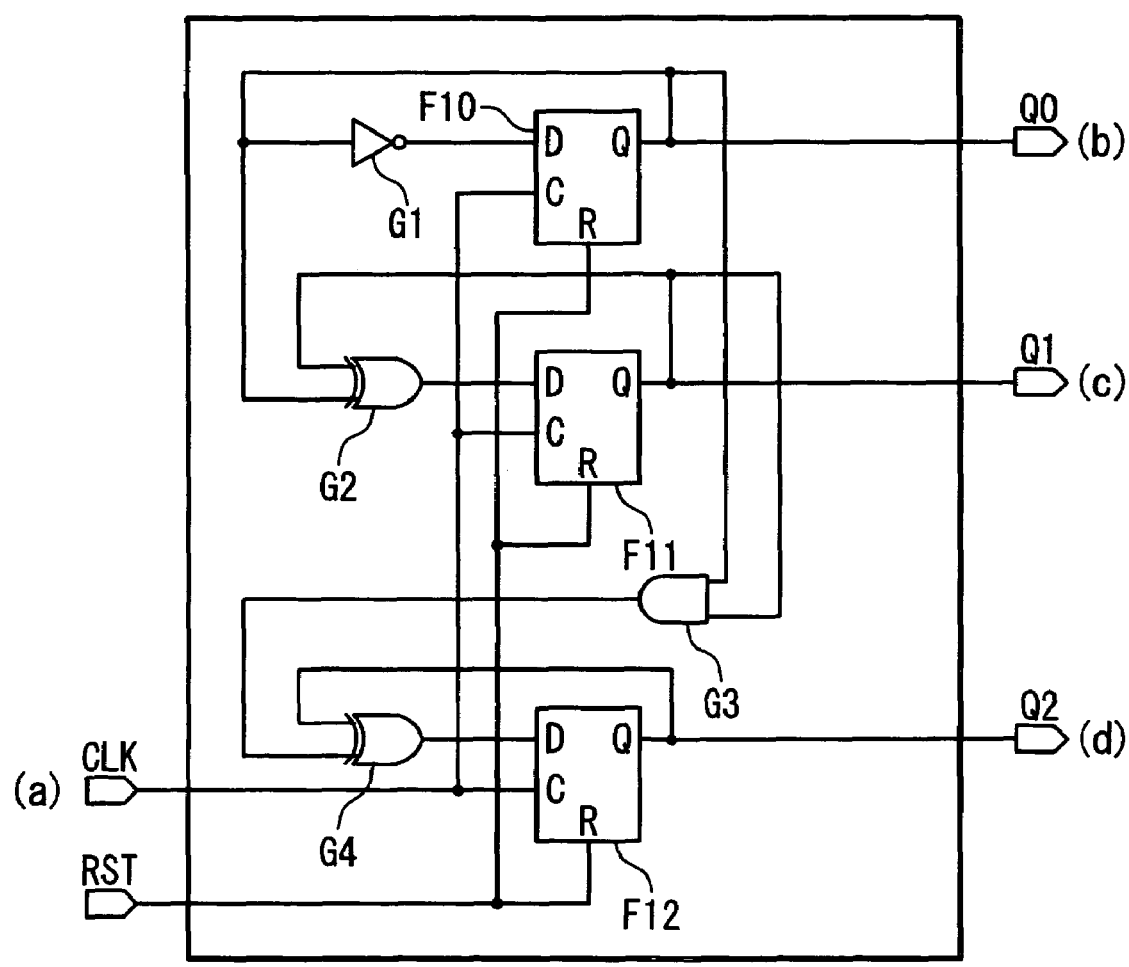
FIG. 1 is a circuit diagram showing a configuration of a conventional counter circuit.
Figure 3:
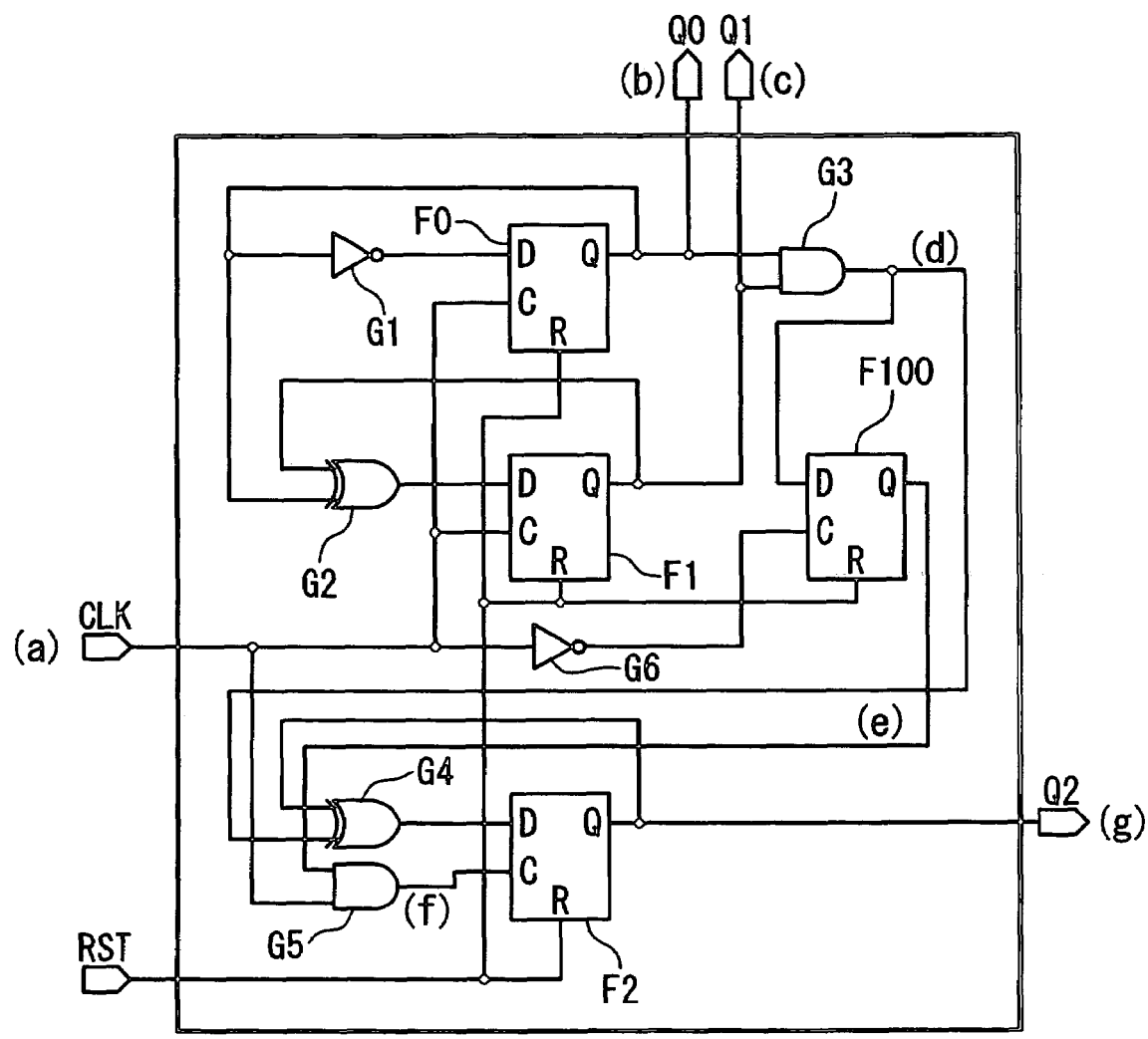
FIG. 3 is a circuit diagram showing a configuration of a counter circuit according to a first embodiment of the present invention.

FIG. 3 is a circuit diagram showing a circuit configuration of the counter circuit according to the first embodiment of the present invention. Referring now to FIG. 3, the counter circuit in the first embodiment of the present invention is a 3-bit counter, and contains a counter section and a mask circuit section. The counter section is provided with flip-flops F0 to F2, an inverter circuit G1, an exclusive OR gate (EXOR) circuit G2, and AND gate circuit G3, and another EXOR circuit G4. The mask circuit section contains a permission signal producing section and a permitting section. The permission signal producing section is provided with an inverter circuit G6 and a flip-flop F100. The permitting section is provided with an EXOR circuit G5.

In the counter circuit of FIG. 3, a clock signal CLK is connected to clock signal terminals C of the flip-flops F0 and F1, is connected via the AND gate circuit G5 to a clock signal terminal C of the flip-flop F2, and is connected via the inverter circuit G6 to a clock signal terminal C of the flip-flop F100. A reset signal RST is connected to reset terminals R of the flip-flops F0 to F2, and F100. An output terminal Q0 of the flip-flop F0 is connected to an external output terminal Q0 and is also connected to a data input terminal D of the flip-flop F0 via the inverter circuit G1, and to one input terminal of the EXOR circuit G2 and one input terminal of the AND gate circuit G3. An output terminal Q1 of the flip-flop F1 is connected to an external output terminal Q1, and is also connected to another input terminal of the EXOR circuit G2 and another input terminal of the AND gate circuit G3. The output terminal of the EXOR circuit G2 is connected to a data input terminal D of the flip-flop F1. The output terminal of the AND gate circuit G3 is connected to a data input terminal D of the flip-flop F100 and one input terminal of the EXOR circuit G4. An output of the flip-flop F100 is connected as a permission signal to one input terminal of the AND circuit G5. An output terminal Q2 of the flip-flop F2 is connected to an external output terminal Q2, and is also connected to another input terminal of the EXOR circuit G4. The output terminal of the EXOR circuit G4 is connected to a data input terminal D of the flip-flop F2. The clock signal CLK is connected to another input terminal of the AND gate circuit G5. The output terminal of the AND gate circuit G5 is connected to a clock input terminal of a flip-flop F2.

Next, an operation of the counter circuit in the first embodiment shown in FIG. 3 will now be described with reference to FIG. 4A to FIG. 4G.

First, the reset signal RST is supplied to the flip-flops F0 to F2 and F100, so that the outputs Q0 to Q2 and Q of the flip-flops F0 to F2 and F100 become "0" as shown in FIG. 4B to FIG. 4G. The output Q0 (="0") of the flip-flop F0 is inverted into "1" by the inverter circuit G1, and the inverted output "1" is supplied to the data input terminal D of the flip-flop F0. Since the output Q0 of the flip-flop F0 and the output Q1 of the flip-flop F1 are both equal to "0", the EXOR circuit G2 supplies "0" to the data input terminal D of the flip-flop F1. Also, since the output of the AND gate circuit G3 is equal to "0", "0" is supplied to the data input terminal of the flip-flop F100 and the input terminal of the EXOR circuit G4. Also, since the output Q of the flip-flop F2 is equal to "0", the EXOR circuit G4 supplies "0" to the data input terminal D of the flip-flop F2. Also, since the output of the flip-flop F100 is equal to "0", the flip-flop F100 outputs a mask signal (non-permission signal) to the AND gate circuit G5. As a result, even when the clock signal is supplied to the AND gate circuit G5, the AND gate circuit G5 does not supply the clock signal to the clock signal terminal C of the flip-flop F100.

Figure 4:
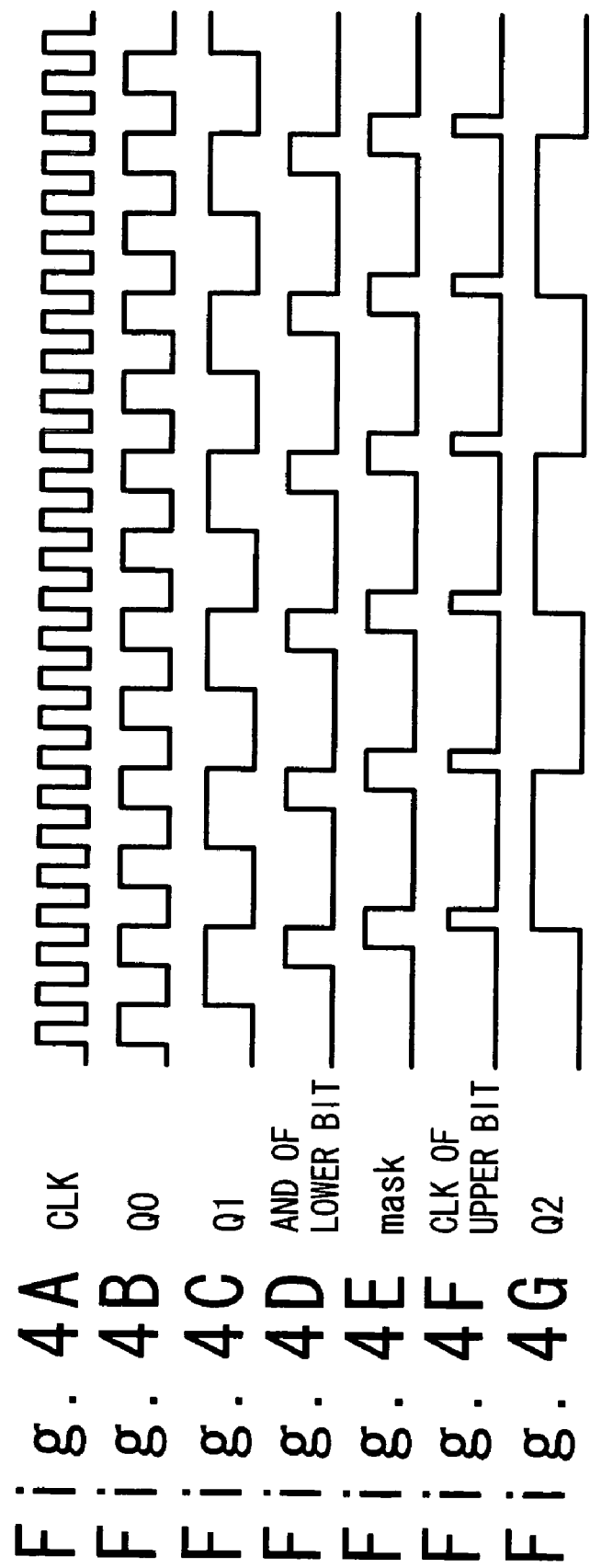
FIGS. 4A to 4G are timing charts showing an operations of the counter circuit in the first embodiment.

In this state, a first pulse of the clock signal CLK is supplied to the flip-flops F0 to F2 and F100 as shown in FIG. 4A. As a result, in response to the first pulse of the clock signal CLK, the output Q0 of the flip-flop F0 changes from "0" to "1", and the output Q1 of the flip-flop F1 remains at "0", as shown in FIG. 4B to FIG. 4G. Since the clock signal CLK is not supplied to the flip-flop F2, the output Q of the flip-flop F2 remains at "0", and also the output Q of the flip-flop F100 remains at "0". As a result, the output Q0 (="1") of the flip-flop F0 is inverted to "0" by the inverter circuit G1, and "0" is supplied to the data input terminal D of the flip-flop F0. Since the output Q0 of the flip-flop F0 is equal to "1" and the output Q1 of the flip-flop F1 is equal to "0", the EXOR circuit G2 supplies "1" to the data input terminal D of the flip-flop F1. Also, since the output of the AND gate circuit G3 is equal to "0", the EXOR circuit G4 supplies "0" to the data input terminal D of the flip-flop F2. Further, the output Q of the flip-flop F100 is equal to "0", and the flip-flop F100 outputs the mask signal (non-permission signal) to the AND gate circuit G5. As a result, even when the clock signal CLK is supplied to the AND gate circuit G5, this AND gate circuit G5 does not supply the clock signal CLK to the clock signal terminal C of the flip-flop F2.

In this state, a second pulse of the clock signal CLK is supplied to the flip-flops F0 to F2, and F100, as shown in FIG. 4A. As a result, as shown in FIG. 4B to FIG. 4G, in response to the second pulse of the clock signal CLK, the output Q0 of the flip-flop F0 changes from "1" to "0", and the output Q1 of the flip-flop F1 changes from "0" to "1". Since the clock signal CLK is not supplied to the flip-flop F2, the output Q2 of the flip-flop F2 remains at "0", and the output Q of the flip-flop F100 remains at "0". The output Q0 (="0") of the flip-flop F0 is inverted into "1" by the inverter circuit G1, and "1" is supplied to the data input terminal D of the flip-flop F0. Since the output Q0 of the flip-flop F0 is equal to "0" and the output Q1 of the flip-flop F1 is equal to "1", the EXOR circuit G2 supplies "1" to the data input terminal D of the flip-flop F1. Also, the AND circuit G3 supplies "0" to the data input terminal D of the flip-flop F100 and the input terminal of the EXOR circuit G4. Since the output Q2 of the flip-flop F2 is equal to "0", the EXOR circuit G4 supplies "0" to the data input terminal D of the flip-flop F2. Also, the output Q of the flip-flop F100 is equal to "0", and the flip-flop F100 outputs the mask signal (non-permission signal) to the AND gate circuit G5. As a result, even when the clock signal CLK is supplied to the AND gate circuit G5, the AND gate circuit G5 does not supply the clock signal CLK to the clock signal terminal C of the flip-flop F2.

In this state a third pulse of the clock signal CLK is supplied to the flip-flops F0 to F2, and F100, as shown in FIG. 4A. As a result, in response to a rising edge of this third pulse of the clock signal CLK, the output Q0 of the flip-flop F0 changes from "0" to "1", and the output Q1 of the flip-flop F1 remains at "0", as shown in FIG. 4B to FIG. 4G. Since the clock signal CLK is not supplied to the flip-flop F2, the output Q2 of the flip-flop F2 remains at "0". The output Q0 (=1) of the flip-flop F0 is inverted into "0" by the inverter circuit G1, and "0" is supplied to the data input terminal D of the flip-flop F0. Since the output Q0 of the flip-flop F0 is equal to "1" and the output Q1 of the flip-flop F1 is equal to "1" the output of the EXOR circuit G2 is equal to "0", and the EXOR circuit G2 supplies "0" to the data input terminal D of the flip-flop F1. Also, the output of the AND gate circuit G3 becomes "1". Since the output Q2 of the flip-flop F2 is equal to "0", the EXOR circuit G4 supplies "1" to the data input terminal D of the flip-flop F2.

The output states of the flip-flop F0 and F1 have already changed in synchronism with the rising edge of the third pulse of the clock signal CLK. Therefore, the output of the AND circuit G3 has already become "1" before a falling edge of the third pulse of the clock signal CLK. The clock signal CLK is supplied via the inverter circuit G6 to the flip-flop F100. The flip-flop F100 latches the output of the AND gate circuit G3 in synchronism with the falling edge of the third pulse, and outputs "1". Thus, the flip-flop F100 outputs the mask signal (permission signal) to the AND gate circuit G5. As a result, when the clock signal CLK is supplied to the AND gate circuit G5, the AND gate circuit G5 permits to supply the clock signal CLK to the clock signal terminal C of the flip-flop F2.

Next, a fourth pulse of the clock signal CLK is supplied to the flip-flops F0 to F2, as shown in FIG. 4A. As a result, as shown in FIG. 4B to FIG. 4D, in response to the fourth pulse of the clock signal CLK, the output Q0 of the flip-flop F0 changes from "1" to "0", and the output Q1 of the flip-flop F1 changes from "1" to "0". Also, the output Q2 of the flip-flop F2 changes from "0" to "1". The output Q0 (=0) of the flip-flop F0 is inverted into "1" by the inverter circuit G1, and "1" is supplied to the data input terminal D of the flip-flop F0. Since the output Q0 of the flip-flop F0 is equal to "0" and the output Q1 of the flip-flop F1 is equal to "0", the EXOR circuit G2 supplies "0" to the data input terminal D of the flip-flop F1. Thus, the output of the AND gate circuit G3 becomes "0". Since the output Q2 of the flip-flop F2 is equal to "1", the EXOR circuit G4 supplies "1" to the data input terminal D of the flip-flop F2.

Both the output states of the flip-flop F0 and F1 have already been changed in synchronism with the rising edge of the fourth pulse of the clock signal CLK. Therefore, the output of the AND gate circuit G3 has already become "0" before the falling edge of the fourth pulse of the clock signal CLK. The clock signal CLK is supplied via the inverter circuit G6 to the flip-flop F100. The flip-flop F100 latches the output of the AND gate circuit G3 in synchronism with the falling edge of the fourth pulse, and outputs "0". Thus, the flip-flop F100 outputs the mask signal (permission signal) to the AND gate circuit G5. As a result, when the clock signal CLK is supplied to the AN gate circuit G5, the AND gate circuit G5 prohibits to supply the clock signal CLK to the clock signal terminal C of the flip-flop F2.

Hereinafter, a similar operation to the above-explained operation is repeatedly carried out.

In the counter circuit shown in FIG. 3 according to the first embodiment of the present invention, the conventional counter circuit shown in FIG. "1" is divided into the upper bit section and the lower bit section, and the mask circuit section is added for the upper bit section. In order to adjust the timing of the carrying-up operation from the lower bit section to the upper bit section, the mask circuit section generates the permission signal based upon the AND operation result of the output data of all the flip-flops in the lower bit section.

Through the circuit configuration shown in FIG. 3, the number of times of the operations of the flip-flops in the counter circuit can be reduced. First of all, an AND operation output of the outputs Q0 and Q1 of the flip-flops F0 and F2 in the lower bit section is generated. Subsequently, in order to adjust timing, the AND operation output of the lower bit section is latched by the flip-flop F100 in synchronism with the inverted signal of the clock signal CLK, a mask signal (permission/non-permission signal) is outputted. Then, the AND gate circuit G5 permits or prohibits the clock signal CLK to be supplied to the clock input terminal C of the flip-flop F2. Thus, a clock signal is generated that only the pulse of the clock signal which rises when the carrying-up operation of the lower bit section is performed becomes valid with respect to the clock signal CLK, and the generated clock signal is used as the clock signal CLK of the upper bit section. Thus, the number of times of the operation of the upper bit section can be reduced. This is expressed in the form of the following equation. That is, the number of times of operations of the flip-flops when an N-bit counter circuit fully counts the clock pulses is $2^N \times N$ times when the counter circuit is not divided, and is $2^N \times A + 2^{(N-A)} \times B$ times (N=A+B) when the counter circuit is divided as described in the first embodiment of the present invention. For example, in case of a full counting operation (=FFh) by an 8-bit counter circuit, $2^8 \times 8 = 2048$ times of operations of the flip-flops are required when the counter circuit is not divided. On the other hand, only $2^8 \times 2 + 2^6 \times 6 = 896$ times of the operations of the flip-flops are required when the counter circuit is divided into the lower and upper bit sections, if a clock is supplied to the upper bit section only when a carrying-up operation from the lower bit section to the upper bit section is performed. Since the flip-flops are not operated for a difference between 2048 and 896, power consumption thereof can be suppressed.

As described above, the supply of the clock signal to the upper bit section can be reduced. As a result, the number of times of the operations of the flip-flops provided in the upper bit section can be decreased. If the number of times of the operations of the flip-flops is decreased, the power consumption can be suppressed. Also, since the circuit elements such as the flip-flops in the counter circuit are not operated, the generation of noise is possibly reduced.

In addition, the mask circuit sections shown in FIG. 3 may be provided to be plural in the counter circuit. In this case, when the outputs of flip-flops from a first-stage to a stage just before the relevant stage become "1", each of these mask circuit sections validates a clock signal to be supplied to the relevant flip-flop.

The counter circuit explained in the first embodiment is a 3-bit counter circuit of the flip-flops F0 to F2. However, the number of times of operations of the flip-flops to a full count increases, as the number of bits increases. In this case, a circuit configuration may be employed in accordance with a second embodiment of the present invention.

Next, the counter circuit according to the second embodiment of the present invention will be described below. It is supposed that the counter circuit is a 6-bit counter circuit h flip-flops F0 to F5.

Figure 5:
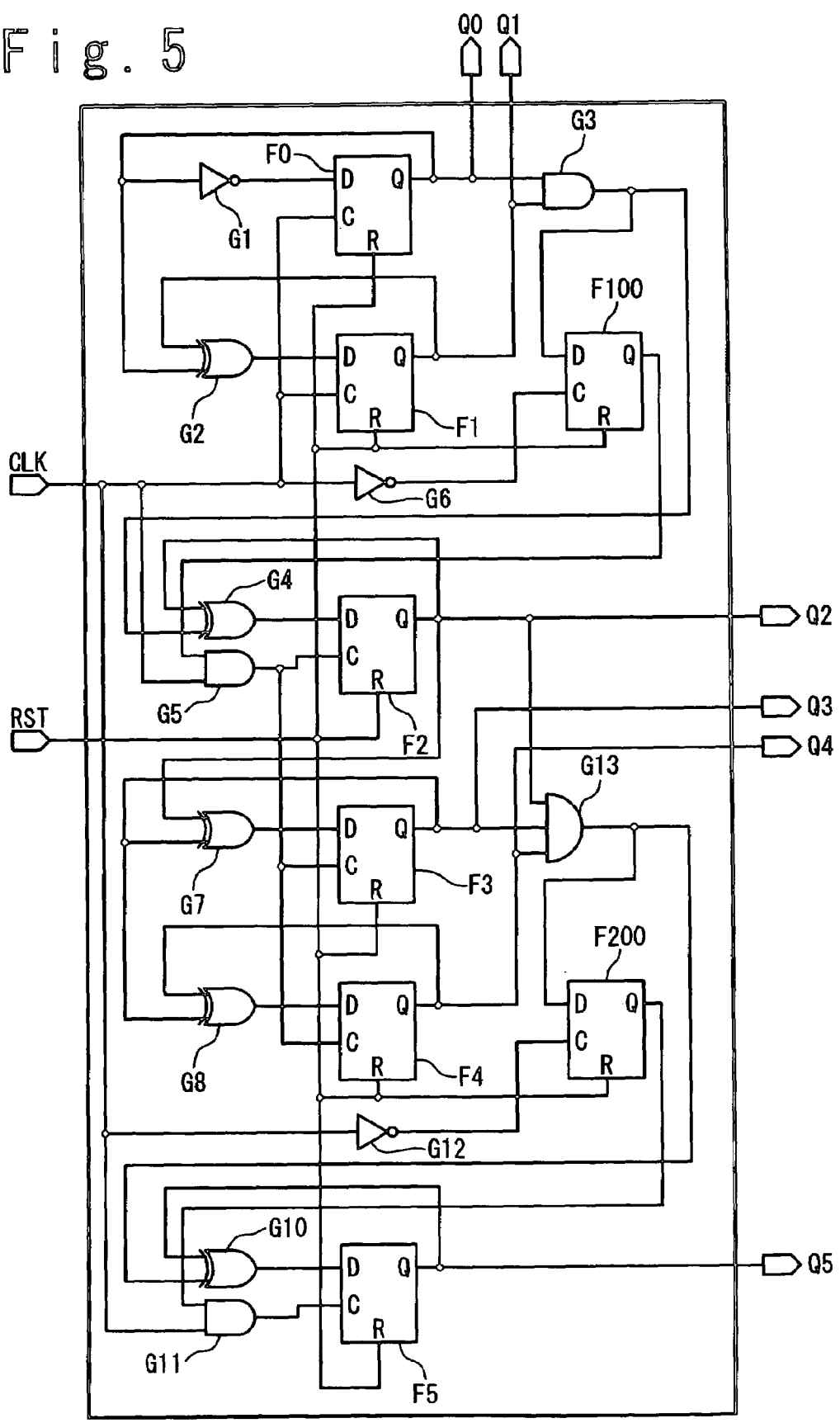
FIG. 5 is a circuit diagram showing a configuration of the counter circuit according to a second embodiment of the present invention.

Referring now to FIG. 5, the configuration of the flip-flop F0 to F2 corresponding to first to third bits is same as the configuration shown in FIG. 3. A reset signal is supplied to reset terminals of the flip-flops F0 to F5. In the flip-flop F2 corresponding to the third bit, the same operation as described above is carried out. An EXOR circuit G7 outputs an exclusive OR operation result of an output Q2 of the flip-flop F2 and the output of the flip-flop F3 is supplied to the data input terminal D of the flip-flop F3. Also, an EXOR circuit G8 outputs an exclusive OR operation result of an output Q3 of the flip-flop F3 and the output of the flip-flop F4 is supplied to the data input terminal D of the flip-flop F4. A second mask flip-flop F200 as a second permission signal generating circuit is provided for the flip-flops F2 to F4, like the flip-flop F100. Connections of the flip-flops F2 to F4 and the second mask flip-flop are similar to those of the flip-flops F0 to F1 and F100. An inverter G12 receives the clock signal CLK and supplies the inverted clock signal to the clock signal terminal of the second mask flip-flop F200. An AND circuit G13 receives the outputs of the flip-flops F2 to F4 and outputs a logical product of the outputs of the flip-flops F2 to F4 to the data input terminal D of the second mask flip-flop F200 and an EXOR circuit G10. In the flip-flop F5, the EXOR circuit G10 calculates an exclusive OR operation of the output of the AND circuit G13 and the output Q5 of the flip-flop F5 and supplies the result of the exclusive OR operation to the data input terminal D of the flip-flop F5, like the flip-flop F2. An AND circuit G11 calculates a logical product of the clock signal CLK and the output of the second mask flip-flop F200 as a permission signal and supplies the result of the logic product to the clock signal terminal C of the flip-flop F5. That is, the output of the AND circuit G5 is supplied as a first clock signal to the clock signal terminals of the flip-flops F3 and F4, similar to the flip-flop F2. Thus, the flip-flop F200 functions as a second permission signal producing circuit.

Next, an operation of the counter circuit according to the second embodiment of the present invention will be described with reference to FIGS. 6A to 6M. As shown in FIGS. 6A to 6M, the same clock signal as the clock signal supplied to the clock signal terminal of the flip-flop F2 is supplied as a first clock signal to the clock signal terminal of the flip-flop F3 and F4. The output of the AND circuit G13, i.e., a logical product of the outputs of the flip-flops F2 to F4 is supplied to the data input terminal of the flip-flop F200 functioning as the second permission signal producing circuit, which outputs a second permission signal in synchronism with a clock signal which is inverted by the inverter circuit G12. Then, this second permission signal (mask2) is supplied to the AND circuit G11. Also, the clock signal CLK is supplied to the AND circuit G11. The AND circuit G11 outputs a logical product of them as a second clock signal to the flip-flop F5. The flip-flop F5 receives the output of the EXOR circuit G10 at the data input terminal D and outputs a data Q5 in synchronism with the second clock signal.

As previously described, if divisions of the counter circuit is increased by using a plurality of mask circuit sections, a total number of times of operations of the flip-flops can be reduced. In a conventional case, when an N-bit counter circuit is fully counted, the number of times of operations of the flip-flops is $2^N \times N$ times. On the other hand, a total number of times of the operations of the flip-flops in the counter circuit of the second embodiment is $2^N \times A + 2^{(N-A)} \times$ $B+2^{(N-A-B)} \times C$ times (N=A+B+C). For example, it is supposed that a 16-bit counter circuit fully counts up to a full value (=FFFFh). In this case, if the counter circuit is not divided, $2^{16} \times 16 = 1,048,576$ times of operations of flip-flops are required. On the other hand, if the counter circuit is divided as in the first embodiment, $2^{16} \times 3 + 2^{13} \times 13 = 303,104$ times of the operations of the flip-flops are only required. Moreover, if the counter circuit is divided as in the second embodiment, a total number of times of operations of the flip-flops is $2^{16} \times 2 + 2^{14} \times 3 + 2^{11} \times 11 = 202,752$ times. Thus, the total operation times may be further decreased.

It should be noted that a dividing number may be preferably determined by considering the number of divisions of the counter circuit and the number of bits in each division, since there is a risk that a total number of circuit elements is increased rather than an increase of operation times when a bit portion number is small. The method of increasing the division number may be especially made effective in a counter circuit whose bit number is large.

As described above, according to the present invention, in the counter circuit, since this counter circuit is divided into a plurality of bit sections, the total operation time of the flip-flops of this counter circuit can be reduced, the power consumption can be lowered, and also, the possibilities of the noise generation can be decreased.

What is claimed is:

1. A counter circuit comprising:
a binary counter section comprising flip-flops of a plurality of stages, wherein said flip-flops from a first stage to an (N-1)th stage (N is an integer more than 2) synchronously count a clock signal; and
a mask circuit section configured to control supply of said clock signal to said flip-flop of an Nth stage based on an output of each of said flip-flops from said first stage to said (N-1)th stage,
wherein said mask circuit section comprises a mask flip-flop, said mask flip-flop not comprising a stage of said binary counter section.

2. The counter circuit according to claim 1, wherein said mask circuit section comprises:
a permission signal generating section configured to generate a permission signal based on the outputs of each of said flip-flops from said first stage to said (N-1)th stage; and
a permitting section configured to permit the supply of said clock signal to said flip-flop of said Nth stage based on said permission signal.

3. The counter circuit according to claim 2, wherein said permission signal generating section comprises:
said mask flip-flop configured to receive a logical product of the outputs of said flip-flops from said first stage to said (N-1)th stage in synchronization with said clock signal, and to output said permission signal from an output terminal thereof, and
said permitting section comprises:
a logical product circuit configured to supply a logical product of said permission signal and said clock signal to a clock signal terminal of said flip-flop of said Nth stage.

4. The counter circuit according to claim 2, wherein said permission signal generating section generates said permission signal before the supply of said clock signal to said flip-flop of said Nth stage is permitted by a half period of said clock signal.

5. The counter circuit according to claim 3, wherein said permission signal generating section flintier comprises:
an inverter circuit configured to invert said clock signal, and
said mask flip-flop receives said clock signal inverted by said inverter circuit at a clock signal terminal thereof.

6. A counter circuit comprising:
a counter section comprising flip-flops of a plurality of stages, wherein said flip-flops from a first stage to an (N-1)th (N is an integer more than 2) stage synchronously count a clock signal; and
a first mask circuit section configured to supply a first clock signal generated from said clock signal based on an output of each of said flip-flops from said first stage to said (N-1)th stage to said flip-flop of an Nth stage, wherein said flip-flops from said Nth stage to an (M-1)th stage (M is an integer more than N) synchronously count said first clock signal; and
a second mask circuit section configured to control a supply of a second clock signal generated from said clock signal based on an output of each of said flip-flops from said Nth stage to said (M-1)th stage to said flip-flop of an Mth stage.

7. The counter circuit according to claim 6, wherein said first mask circuit section comprises:
a first permission signal generating section configured to generate a first permission signal based on the output of each of said flip-flops from said first stage to said (N-1)th stage; and
a first permitting section configured to permit said clock signal to be supplied to said flip-flop of said Nth stage as said first clock signal based on said first permission signal, and
said second mask circuit section comprises:
a second permission signal generating section configured to generate a second permission signal based on the output of each of said flip-flops from said Nth stage to said (M-1)th stage; and
a second permitting section configured to permit said clock signal to be supplied to said flip-flop of said Mth stage as said second clock signal based on said second permission signal.

8. The counter circuit according to claim 7, wherein said first permission signal generating section comprises:
a first mask flip-flop configured to receive a logical product of the outputs of said flip-flops from said first stage to said (N-1)th stage at a data input terminal thereof in synchronization with said clock signal and to output said first permission signal from an output terminal thereof,
said first permitting section comprises:
a first logical product circuit configured to supply a logical product of said first permission signal and said clock signal to a clock signal terminal of said flip-flop of said Nth stage as said first clock signal,
said second permission signal generating section comprises:
a second mask flip-flop configured to receive a logical product of the outputs of said flip-flops from said Nth stage to said (M-1)th stage at a data input terminal thereof in synchronization with said first clock signal and to output said second permission signal from an output terminal thereof, and
said second permitting section comprises:
a second logical product circuit configured to supply a logical product of said second permission signal and said clock signal to a clock signal terminal of said flip-flop of said Mth stage as said second clock signal.

9. The counter circuit according to claim 7, wherein said first permission signal generating section generates said first permission signal before a supply of said clock signal to said flip-flop of said Nth stage is permitted by a half period of said clock signal, and said second permission signal generating section generates said second permission signal before the supply of said clock signal to said flip-flop of said Mth stage is permitted by a half period of said clock signal.

10. The counter circuit according to claim 8, wherein said first permission signal generating section further comprises a first inverter circuit to invert said clock signal, said first mask flip-flop receives said clock signal inverted by said first inverter circuit at the clock signal terminal, said second permission signal generating section further comprises a second inverter circuit to invert said clock signal, and said second mask flip-flop receives said clock signal inverted by said second inverter circuit at the clock signal terminal.

11. A method of counting a clock signal, comprising:

synchronously counting a clock signal by flip-flops from a first stage to an (N-1)th stage (N is an integer more than 2);

generating a first clock signal from said clock signal based on an output of each of said flip-flops from said first stage to said (N-b 1)th stage;

counting said first clock signal by a flip-flop of an Nth stage;

synchronously counting said first clock signal by said flip-flops from said Nth stage to an (M-1)th stage (M is an integer more than N) stage;

generating a second clock signal from said clock signal based on outputs of each of said flip-flops from said Nth stage to an (M-1)th stage; and counting said second clock signal by a flip-flop of an Mth stage.

12. The method according to claim 11, wherein said generating a first clock comprises:

generating a first permission signal based on the output of each of said flip-flops from said first stage to said (N-1)th stage; and generating said first clock signal from said clock signal in response to said first permission signal to supply to said flip-flop of said Nth stage, and said generating a second clock signal comprises:

generating a second permission signal based on the output of each of said flip-flops from said Nth stage to an (M-1)th stage; and generating said second clock signal from said clock signal in response to said second permission signal to supply to said flip-flop of said Mth stage.

13. The method according to claim 12, wherein said generating said second clock signal comprises:

generating said first permission signal before timing at which said clock signal should be supplied to said flip-flop of said Nth stage by a half period of said clock signal, and said generating said second clock signal comprises:

generating said second permission signal before a timing at which said clock signal should be supplied to said flip-flop of said Mth stage by a half period of said clock signal.

* * * * *